United States Patent [19]
Wimmer

[11] Patent Number: 4,885,554
[45] Date of Patent: Dec. 5, 1989

[54] PHASE-OFFSET SIGNAL GENERATOR

[75] Inventor: Guenther W. Wimmer, Portland, Oreg.

[73] Assignee: Tektronix, Inc., Beaverton, Oreg.

[21] Appl. No.: 285,260

[22] Filed: Dec. 16, 1988

[51] Int. Cl.[4] ............................................. H03L 7/00
[52] U.S. Cl. ...................................... 331/25; 328/155
[58] Field of Search ................... 331/18, 25; 328/133, 328/134, 155; 307/511

[56] References Cited

U.S. PATENT DOCUMENTS

| | | | |
|---|---|---|---|
| 4,330,717 | 5/1982 | Coleman | 328/133 X |
| 4,626,796 | 12/1986 | Elder | 331/25 X |
| 4,716,363 | 12/1987 | Dukes et al. | 331/25 X |
| 4,819,196 | 4/1989 | Lilley et al. | 331/25 X |

Primary Examiner—Eugene R. Laroche
Assistant Examiner—Robert J. Pascal

Attorney, Agent, or Firm—Edward B. Anderson; RObert S. Hulse

[57] ABSTRACT

A device for generating a digitizing pulse for sampling an analog video signal includes a phaes-locked-loop (PLL) circuit and a phase offset circuit. The PLL circuit generates a correction pulse required to bring an output signal of digitizing pulses in phase with a reference horizontal sync signal. The phase offset circuit includes a digital memory which stores a digital number representative of a fraction of a pixel pulse that is desired as phase offset of the digitizing pulse. This fraction is converted into an offset current pulse having a duration equal to the duration of a pixel pulse and an amplitude that is the fraction of a maximum amplitude. The offset current is added to the PLL correction current for generating an output signal of digitizing pulses having the desired phase offset relative to the pixel pulses.

16 Claims, 3 Drawing Sheets

PHASE-OFFSET SIGNAL GENERATOR

FIELD OF THE INVENTION

This invention relates to signal synchronization, and more particularly, to a device and method for generating an output signal having a programmable phase relationship to an input signal.

BACKGROUND AND SUMMARY OF THE INVENTION

Many systems exist wherein a reference signal having a predetermined frequency is sampled or reconstructed after being transmitted. Such reference signals often have information associated with the reference signal frequency. In order to recover the information from the signal, it is necessary to reestablish the frequency and phase of the reference signal. Environments in which such signals may appear include communications systems, computer disk drive systems, and video systems. In video imaging systems, a particular frequency is used to transmit data, such as pixel (picture element) information for producing a digital image of an analog video signal. Certainly other applications also exist.

The preferred embodiment of the present invention is directed to video digitizers wherein an analog video signal, constituting a displayed raster image, is quantitized and subsequently reduced to a hard-copy rendition by a printer.

The video signal is composed of a stream of discrete and generally differing analog values corresponding to viewable pixels and non-viewable image justification elements required to construct an image frame on a CRT display. The image frame is output by the display system at a periodic rate in "row/column" format. Timing and synchronization information required to delineate line and frame boundaries may be embedded in the video signal or conveyed through separate signal paths. A plurality of video signals are generally required to support color images.

The video digitizer may capture the display image through oversampling at greater than the Nyquist rate with attendant image processing and memory size and/or bandwidth penalties, or through synchronous sampling where each pixel of the analog video signal is sampled once per primary color. The latter topology requires a phase coherent digitizing signal, but offers significant advantages in reducing cost and complexity of implementation, which advantages accrue directly from the present invention.

Synchronous sampling in a video environment dictates that the display system pixel clock be available for generation of the digitization signal. As the pixel clock is generally not available outside the display system it must be reconstructed from the timing/synchronization signals output to the CRT display. The timing/synchronization signals are H Sync and V Sync representing display line and frame delimiters respectively.

Conventionally, pixel clock recovery is accomplished through phase locked loop frequency synthesis using H Sync as the PLL reference. The PLL multiplies the input frequency, H Sync, by the value placed in the feedback scaler of the PLL. Specifying a value equal to the display system's total number of pixels per display line (viewable & non-viewable) results in a PLL clock output frequency equal to the display system pixel clock frequency. Assuming an ideal PLL implementation, zero phase error will be observed between the PLL reference signal (H Sync) and the PLL feedback ("carry" output from the feedback scaler) and clock output signals. The recovered pixel clock (PLL clock) may then be used through selectively gating to form the digitization signal to an analog to digital convertor for the purpose of quantitizing the analog video signal on a per pixel basis.

The digitization signal is synchronous and phase coherent to the analog video signal, it however may not exhibit the optimum phase relationship for sampling of video due to differential delays within the display system, cable delays, less than ideal PLL implementations, etc. Furthermore, the video signal may exhibit amplitude aberrations in the form of ringing, due to bandwidth limitations, and/or due to the introduction of synchronous artifacts from the display system controller.

Conventionally, sampling phase adjustment is provided by routing the digitization signal through a multiplicity of lumped constant LC delay lines with the delay nodes available at the inputs of digital signal data selectors. The output of the data selector is then made available to the analog to digital convertor conveying a time delayed replica of the original digitization signal. The desired delay is specified via channel select control inputs to the data selector. Disadvantages of this methodology include the minimum delays achievable being greater than the time resolution required, volumetric and power inefficiencies and expense of the delay lines and data selectors, and delay increments being dimensioned in time rather than in percentages of a pixel.

SUMMARY OF THE INVENTION

The present invention provides such a system which has reduced power consumption and hardware, is cost effective, and is easy to calibrate.

This is preferably provided by a device which generates an output signal, such as a digitizing signal, having a programmable phase offset relative to a reference signal, such as a horizontal sync signal. This is accomplished by a phase locked loop (PLL) frequency synthesizer circuit that is responsive to the reference signal and to an offset control signal for generating an output signal having a programmable phase relationship to the reference signal. The phase relationship is determined by the magnitude of the offset signal. A generator is also provided for producing the phase offset signal. This phase offset signal preferably combines with an internal signal of the PLL circuit to generate an adjustment in the phase of the output signal corresponding to those signals.

In a preferred embodiment of the present invention the device for generating the output signal with a phase offset includes a phase detector which generates a phase correcting signal having a fixed amplitude and a duration equal to the phase error between the reference signal (H Sync) and the PLL feedback signal. A digital signal generator produces a digital signal that is representative of the duration of the fraction of one cycle of the output signal desired as a phase offset. To vary the phase offset by more than one cycle is to repeat adjustments within one cycle.

A digital to analog convertor coupled to the phase detector and to the digital signal generator converts the digital signal into an offset signal pulse representative of the desired phase offset. The offset signal pulse has a fixed duration equal to one cycle of the output signal.

The duration is not limited to one cycle, however, and could be other durations depending on the application. Its amplitude may span from 0 to about 100% of the phase correction pulse amplitude in direct response to the digital signal generator. The offset signal pulse occurs once during each cycle of the reference cycle so that an accumulating offset does not occur. The output signal is then generated in response to the phase correction and phase offset signals at a frequency that is a multiple of the reference signal frequency. The output signal is then converted into a feedback signal having the same frequency as the reference signal. The detector detects the feedback signal and compares it to the reference signal to determine actual phase correction required.

In a steady state condition the output signal is in phase with the reference signal but offset by the desired amount. The detector thus generates a correction pulse area that is equal and opposite to the offset signal pulse area. These two signals then compensate each other so that the output is maintained in the offset phase condition. Any other variations in the phase of the feedback and output signals relative to the reference signal are accommodated by the normal function of the phase detector.

This device is easily calibrated. A digital number representing the fraction of one cycle delay desired is simply entered into a digital memory and fed into the digital to analog convertor to generate the offset current. The number of output cycles in a reference signal cycle for a particular installation can simply be entered to generate an output signal of the same frequency as the pixel rate of the analog video signal. The duration of the offset signal pulse is automatically set equal to one cycle of the output signal frequency. At each installation the digital number simply needs to be changed in order to accomplish the desired offset for the particular system being installed.

These and other features and advantages of the present invention will become apparent from a reading of the following detailed description of the preferred embodiment in association with the accompanying drawings.

DETAILED DESCRIPTION OF THE PREFERRED EMBODIMENT

Figure 1:
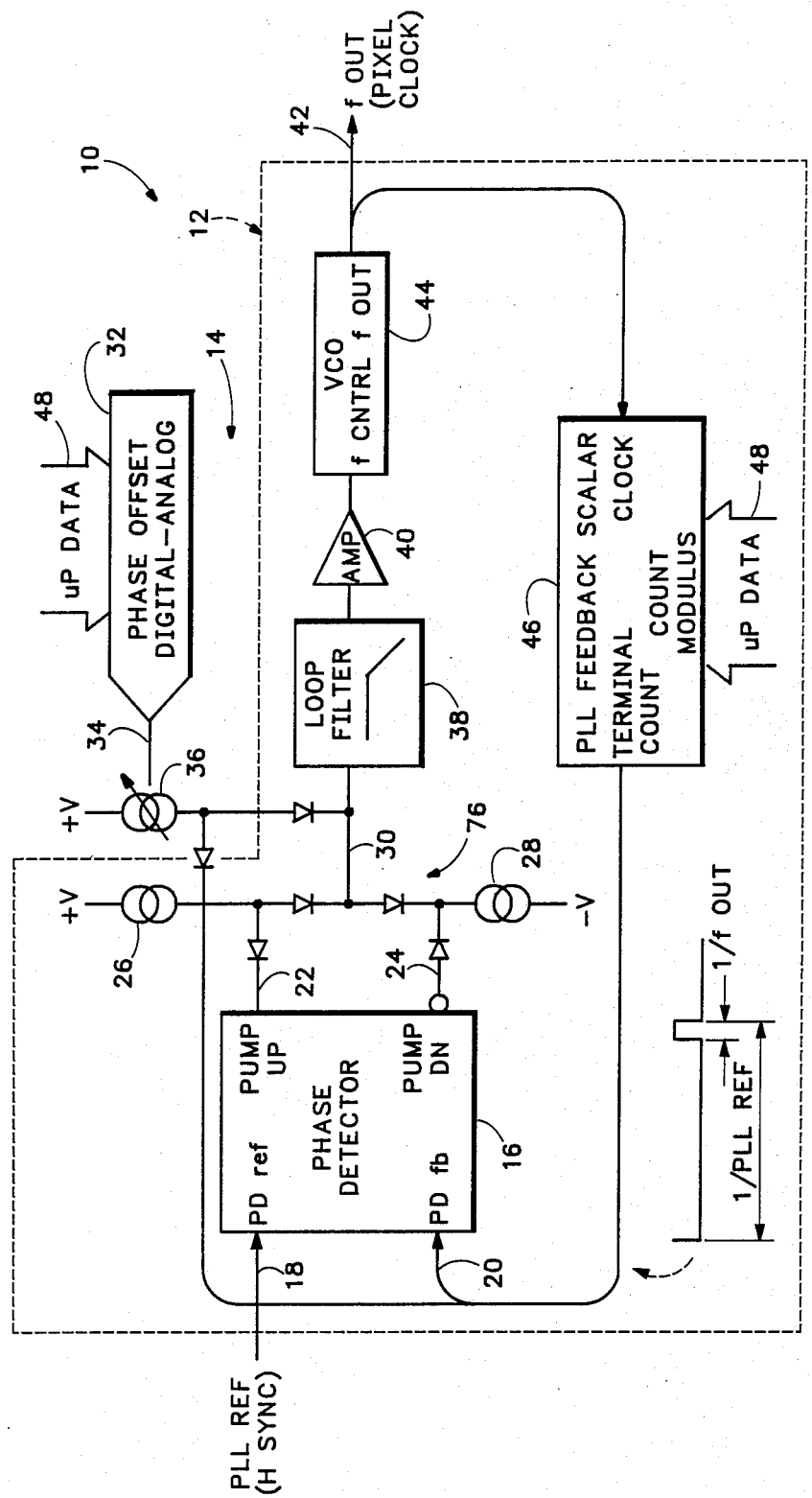
FIG. 1 is a block diagram of a signal generator made according to the present invention.

Referring initially to FIG. 1, a phase offset signal generator made according to the present invention for use in a video sampler is shown generally at 10. Generator 10 includes a PLL circuit shown generally at 12 and a phase offset generator 14. Circuit 12 includes a phase detector 16 responsive to an input or reference signal, such as a horizontal sync signal, on a conductor 18 and a feedback signal on a conductor 20 for generating a correction signal on conductor 22 or 24.

If the reference pulse occurs before the corresponding feedback pulse, detector 16 generates a positive output on conductor 22 for the duration of time difference between the input signals. A negative output is generated on conductor 24 for the converse input signal relationship. The voltage pulses output by detector 16 are converted into corresponding current pulses by current source 26 and current sink 28. These produce an error correcting signal current on conductor 30 having a sign determined by the relationship of the reference and feedback signals and a pulse duration equal to the displacement between the reference and feedback signals.

Phase offset signal generator 14 includes a DAC 32 that generates a control signal on conductor 34 to vary the current from a current source 36. The current source is scaled such that with a full scale input to the DAC, its output is of the same magnitude as the phase detector current sink 28. With a 0 scale input to the DAC the current source 36 output would preferably be zero.

The combined current on conductor 30 is fed into a loop integrator/filter 38 in the form of a low pass filter for removing unwanted high frequency signal components. The filtered signal is fed to an amplifier 40 scaled to produce the desired output signal or sample clock signal on conductor 42 by VCO 44. The output signal is fed back to the PLL feedback scaler unit 46 which divides the output frequency by the number of pixel occurrences in a horizontal line. The scaler value is input on a bus 48. Thus, a single feedback pulse having a period equal to the sample clock signal is output on conductor 20 for each horizontal sync pulse. This pulse is compared to the horizontal sync pulse by the phase detector for generating the phase correction signal. The pulse is also used to enable injection of the phase offset current for generating the desired phase offset. The duration of the phase offset current pulse is therefore the same as this feedback pulse.

Scaler 46 thus provides the frequency multiplication required to generate an output signal from the reference signal. The scaler also converts the output signal into a feedback signal having the same frequency as the input reference signal. Thus, the output signal can have one frequency and be in phase with the input reference signal even though the output signal has a frequency that is a multiple of the frequency of the input signal. In this way, a timing or output signal is generated having a predetermined phase relationship to an input reference signal. This circuit is also functional for producing an output signal having the same frequency as the input signal.

Figure 2:
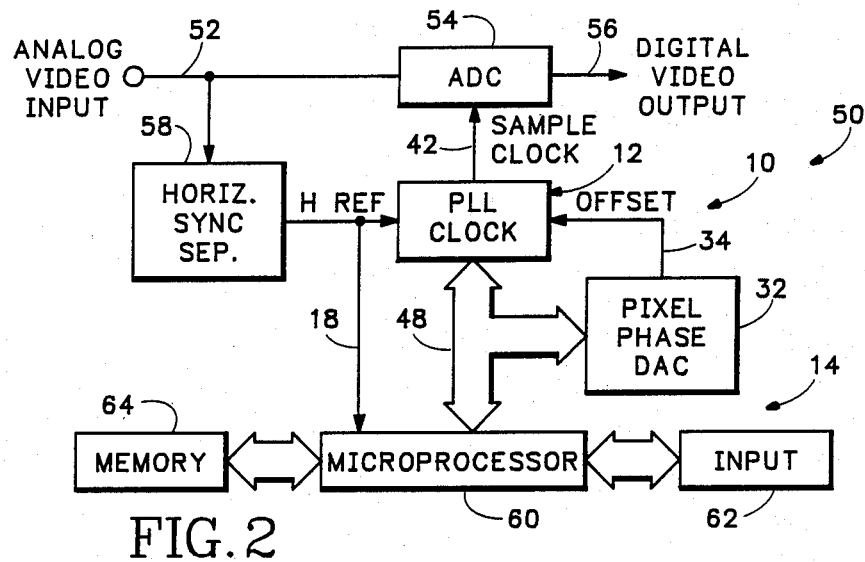
FIG. 2 is a block diagram of a video sampler system incorporating the present invention.

Video sampler apparatus 50 shown in FIG. 2 incorporates generator 10. An analog video signal containing pixel pulses is input on an input conductor 52. This signal is fed into a video sampling circuit in the form of an analog-to-digital convertor (ADC) 54 to produce a digital video output on a conductor 56. The sampling within convertor 54 is determined by a sample clock or digitizing pulse on conductor 42.

The horizontal sync pulse is separated from the input video signal by horizontal sync separator 58. Separator 58 produces a signal which only contains the horizontal sync pulse identified as "H REF" on conductor 18. This signal is fed to PLL clock circuit 12. Phase offset generator 14 includes a microprocessor 60 coupled to an input device 62, such as a keyboard, and a memory unit 64. A digital signal is produced on bus 48 which conveys the digital signal both to PLL circuit 12 and to pixel phase DAC 32. DAC 32 generates from the digital signal the analog control signal on conductor 34 that results in an offset of the phase of the sample clock generated by PLL circuit 12.

Figure 3:
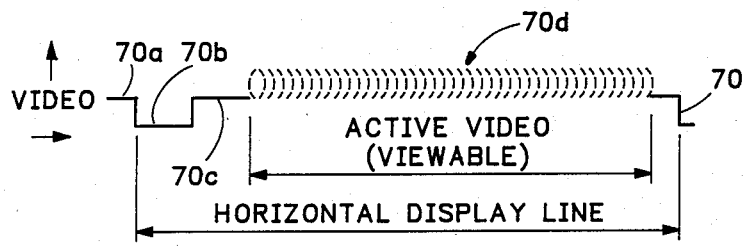
FIG. 3 is a representative line of a video image showing viewable and nonviewable portions.

As an aid in understanding the environment in which the preferred embodiment of phase offset signal generator 10 is used, FIG. 3 shows a video signal display horizontal line 70 containing viewable pixels. Line 70 includes a front porch section 70a, a horizontal sync pulse 70b, and a back porch section 70c. The analog viewable portion of the horizontal line is shown generally at 70d.

Figure 4:
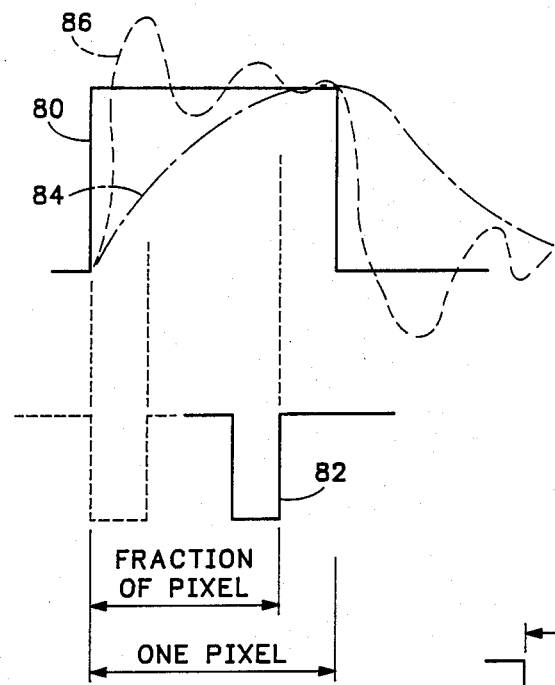
FIG. 4 shows a representative reference pixel pulses and a digitizing pulse that is offset in phase from the pixel pulse in order to produce an accurate sampling of the pixel pulse using the apparatus of FIG. 1.
Figure 5:
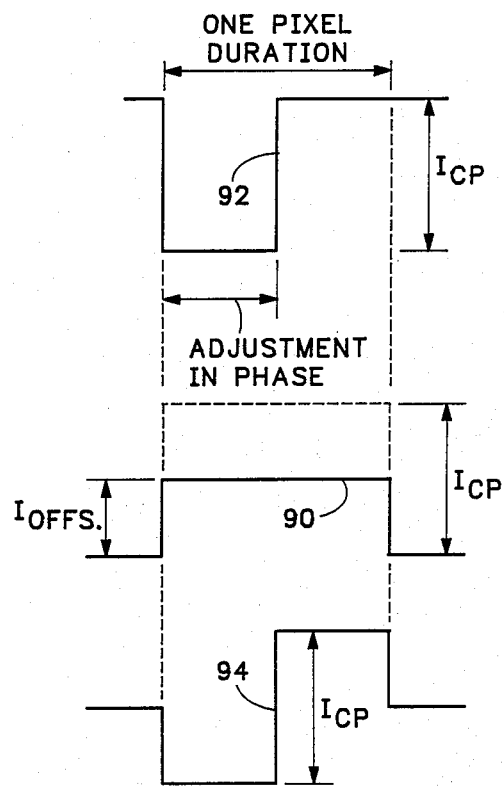
FIG. 5 illustrates the relationship of adjustment and phase offset pulses generated in the apparatus of FIGS. 1.

FIG. 4 shows an illustrative and idealized (in solid line) pixel pulse 80 which it is desired to sample using output pulses 82 from generator 10. In the idealized pixel pulse 80 the pixel value is realized instantaneously with no overshoot. The idealized pulse 80 could actually be sampled at any time period during the pulse and an accurate sampling would be obtained. However, actual pulses may appear as the overdamped pulse 84 shown in dash dot line. This pulse does not reach the quiescent level until the very end of the pulse time period. Further, if the pulse, such as pulse 86, has substantial underdamping so that there are wide fluctuations (ringing) in the pulse at the time of sampling, an early sample may not be representative of the actual pulse level. Either condition would result in a change in color or intensity of the pixel when printed. It can be seen then that it is desirable to locate digitizing pulse 82 in a later time period of a pixel pulse duration. This actual time can be determined by viewing pixel pulses on a test instrument display and selecting a delay which is appropriate for the particular display system for which hard-copies are to be generated.

This delay may be generated interactively or calculated, and input on input device 62 for storage in the memory available for generator 10, as described previously. This digital data is then converted into a corresponding current magnitude for a pulse having a duration equal to that of a pixel pulse, as shown by pulse 90 in FIG. 7.

In the present embodiment the phase detector strives to minimize phase errors between the reference and feedback signals. Injection of an offset current will cause a correction pulse to be produced that has a duration equal to the amount of phase delay needed to bring the feedback signal into phase with the reference signal.

The offset current pulse 90 generated by DAC 32 has a fixed duration equal to the length of one pixel pulse. Current source 36 is controlled to produce a current having a height that is a fraction of $I_{CP}$ equal to the fraction of the pixel pulse duration desired. Thus, it is merely necessary to enter a figure into the input device which represents the fraction offset of the pixel pulse duration desired. It is not necessary to determine the actual time of this delay. That fraction is the fraction of the current, ICP generatable by current source 36 which produces the desired delay.

It can be seen that if the phase detector outputs a pulse 92 which has a duration equal to a known fraction of a pixel pulse width, such as $\frac{1}{2}$, and current source 36 outputs pulse 90 with an amplitude equal to the same fraction of the charge pump current, the two pulse areas are equal, resulting in no net change in output phase. In other words, in a steady state condition, the area of the pulse from phase detector 16 equals the area of the offset pulse produced by current source 36. The resultant error correction signal 94 has equal positive and negative areas, as shown, so that there is no net change in the VCO output.

Although a digital generator is described herein, it will be apparent by those skilled in the art that a simplified version for practicing the present invention is readily designed. In fact, the offset current can be inserted by a device as simple as a rheostat or a thumbwheel, or something analogous to a digital register having manually enterable bit values, which are automatically mapped onto the input of a DAC, similar to that described. The same applies for inputting digital values into the feedback scaler for controlling the frequency of the generator output. It will also be understood that the offset signal could be in the form of a plurality of pulses or other equivalent form.

Thus, although the present invention has been described as a portion of a video sampler, it is apparent that many other applications and designs exist for practicing the method and apparatus of the invention without departing from the spirit and scope of the invention as defined in the claims.

I claim:

1. A device for generating an output signal having a predetermined phase offset relative to a periodic reference signal, said device comprising:
    phase locked loop (PLL) means responsive to the reference signal and to an offset signal representative of the predetermined phase offset from within a predetermined range of phase offsets, for generating an output signal having the predetermined phase offset from the reference signal; and
    phase offset means coupled to said PLL means for generating the offset signal representative of the predetermined phase offset, as a single pulse occurring once each period of the reference signal.

2. A device according to claim 1 wherein the pulse of the offset signal has a fixed duration and the amplitude of the offset signal pulse is representative of the desired phase offset.

3. A device according to claim 2 wherein the offset signal pulse has a duration equal to a maximum desired phase offset and these exists a predetermined amplitude that will produce the maximum desired phase offset with the amplitude to vary the phase offset below the maximum offset.

4. A device for generating an output signal having a predetermined phase offset relative to a reference signal comprising:
    phase locked loop (PLL) means responsive to the reference signal and to an offset signal representative of a predetermined phase offset for generating an output signal having a phase offset from the reference signal, said PLL means including phase detector means for generating a phase correction signal representative of the phase correction required to bring the phase of the output signal in phase with the reference signal, and means for adding the offset signal to the phase correction signal; and
    phase offset means coupled to said PLL means for generating the offset signal representative of the predetermined phase offset.

5. A device according to claim 4 wherein said PLL means generates the output signal with a frequency that is a multiple of the frequency of the reference signal, and said PLL means further comprises means for converting the output signal into a feedback signal having the same frequency as the reference signal, said detector means being responsive to the feedback signal for generating the correction signal.

6. A device according to claim 4 wherein said phase offset means generates the offset signal with an offset pulse having a fixed duration and an amplitude, the product of which generates the desired phase offset.

7. A device according to claim 6 wherein there exists a predetermined amplitude that will produce the maximum desired phase offset with the amplitude being variable below the predetermined amplitude to vary the phase offset below the maximum offset.

8. A device for generating an output signal having a predetermined phase offset relative to a reference signal comprising:
 phase locked loop (PLL) means responsive to the reference signal and to an offset signal representative of the phase offset for generating an output signal having a phase offset from the reference signal; and
 phase offset means coupled to said PLL means for generating the offset signal representative of the predetermined phase offset within a range of phase offsets, said phase offset means including means for generating a digital signal representative of the predetermined phase offset, and digital-to-analog converter (DAC) means for converting the digital signal into an analog signal with a pulse having a fixed duration and an amplitude within a range of amplitudes corresponding to the range of phase offsets, the product of the duration and amplitude generating the predetermined phase offset.

9. A device according to claim 8 wherein there exists a predetermined amplitude which will produce the maximum predetermined offset, the digital signal representing a fraction of the maximum phase offset.

10. A device for generating a time-varying output signal having an output frequency and a predetermined phase offset relative to a time-varying reference signal having a reference frequency, the device comprising:
 phase locked loop (PLL) means responsive to the reference signal and to an offset signal representative of the predetermined phase offset for generating an output signal having a phase offset from the reference signal, the PLL means being controllable to vary the frequency of the output signal, which frequency is a multiple of the frequency of the reference signal; and
 phase offset means, coupled to said PLL means and controllable for generating the offset signal as a pulse representative of the predetermined phase offset, and having a duration with a predetermined relationship to the duration of one cycle of the output signal.

11. A device according to claim 10 wherein said phase offset means generates the phase offset signal once each cycle of the reference signal.

12. A device for generating a periodic output signal having a predetermined phase offset relative to a reference signal having a predetermined frequency comprising:
 phase detector means for generating a phase correction signal pulse having a fixed amplitude and a duration equal to the correction in time required to bring the phase of the output signal in phase with the reference signal;
 means for generating a digital signal representative of the fraction of the duration of one cycle of output signal desired as phase offset;
 digital-to-analog converter (DAC) means coupled to said phase detector means and to said digital signal generating means for converting the digital signal into an offset signal pulse representative of a desired phase offset, with the offset signal pulse having a fixed duration and an amplitude less than a maximum amplitude which produces a maximum phase adjustment in the output signal, the offset signal pulse occurring once for each cycle of the reference signal;
 means responsive to the phase correction and phase offset signals for generating an output signal having the desired phase offset from the reference signal, which output signal has a frequency that is a multiple of the frequency of the reference signal; and
 means for converting the output signal into a feedback signal having the same frequency as the reference signal, said detector means being responsive to the feedback signal for generating the correction signal.

13. A method for offsetting the phase of an output signal relative to the phase of a reference signal comprising:
 generating a correction signal representative of the correction in phase of the output signal required to bring the output signal into phase with the reference signal;
 generating an offset signal representative of the desired offset in phase of the output signal relative to the reference signal;
 combining the offset signal with the correction signal; and
 generating the output signal with a phase determined by the combined adjustment and offset signals.

14. A method according to claim 13 wherein said offset signal generating comprises generating the offset signal as a pulse having a fixed duration and a maximum amplitude representative of the maximum phase offset desired, with the actual offset pulse having an amplitude representative of the desired offset and which is less than the maximum amplitude.

15. A method according to claim 14 wherein the maximum phase offset includes the duration of one cycle of the output signal.

16. A method according to claim 15 wherein said offset signal pulse generating comprises generating a digital signal representative of the fraction of one output signal cycle that is desired as phase offset, converting the digital signal into the offset signal pulse wherein the amplitude of the offset signal pulse is the fraction times the maximum amplitude of the offset signal pulse.

* * * * *